US008782592B2

(12) United States Patent
Mansouri et al.

(10) Patent No.: US 8,782,592 B2
(45) Date of Patent: Jul. 15, 2014

(54) SYSTEM AND METHOD FOR DESIGNING DIGITAL CIRCUITRY WITH AN ACTIVITY SENSOR

(71) Applicant: Commissariat a l'Energie Atomique et aux Energies Alternatives, Paris (FR)

(72) Inventors: Imen Mansouri, Paris (FR); Fabien Clermidy, Saint-Egreve (FR); Pascal Benoit, Castelnau le Lez (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/659,230

(22) Filed: Oct. 24, 2012

(65) Prior Publication Data

US 2013/0125074 A1    May 16, 2013

(30) Foreign Application Priority Data

Nov. 10, 2011 (FR) ...................... 11 60261

(51) Int. Cl.
*G06F 11/22* (2006.01)
*G06F 17/50* (2006.01)

(52) U.S. Cl.
USPC ........... 716/136; 716/106; 716/108; 716/109; 716/132; 716/133

(58) Field of Classification Search
USPC ......... 716/106, 108, 109, 132, 133, 134, 136; 703/13, 14, 32
See application file for complete search history.

(56) References Cited

U.S. PATENT DOCUMENTS

| | | | |
|---|---|---|---|
| 6,370,493 B1 * | 4/2002 | Knapp et al. | 703/14 |
| 6,470,478 B1 * | 10/2002 | Bargh et al. | 716/102 |
| 6,993,470 B2 * | 1/2006 | Baumgartner et al. | 703/17 |
| 7,203,633 B2 * | 4/2007 | Gabele et al. | 703/15 |
| 7,356,786 B2 * | 4/2008 | Schubert et al. | 716/106 |
| 7,454,324 B1 * | 11/2008 | Seawright et al. | 703/14 |
| 7,512,913 B2 * | 3/2009 | Matsuura | 716/136 |
| 8,050,902 B2 * | 11/2011 | Behm et al. | 703/14 |
| 8,407,636 B2 * | 3/2013 | Iwashita | 716/106 |
| 2002/0133792 A1 | 9/2002 | Raghunathan et al. | |
| 2003/0046627 A1 * | 3/2003 | Ku | 714/739 |
| 2004/0090323 A1 * | 5/2004 | Bieringer et al. | 340/444 |
| 2005/0257178 A1 * | 11/2005 | Daems et al. | 716/2 |
| 2009/0150857 A1 | 6/2009 | Srinivasan et al. | |

OTHER PUBLICATIONS

Jorgen Peddersen, et al., "CLIPPER: Counter-based Low Impact Processor Power Estimation at Run-time", Design Automation Conference, ASP-DAC, IEEE, XP031085613, 2007, pp. 890-895.
French Preliminary Search Report and Written Opinion issued Jul. 25, 2012, in French 1160261, filed Nov. 10, 2011 (with English Translation of Categories of Cited Documents).

* cited by examiner

*Primary Examiner* — Jack Chiang
*Assistant Examiner* — Brian Ngo
(74) *Attorney, Agent, or Firm* — Oblon, Spivak, McClelland, Maier & Neustadt, L.L.P.

(57) ABSTRACT

A system for designing digital circuitry comprising: a digital circuit simulator based on a file containing a functional description of this digital circuit; means for estimating an output variable from the digital circuit when executing a test bench supplied to the simulator; event counters, the events being detected using control signals provided by the simulator when executing the test bench. Said system further comprises means for selecting a portion of the event counters by iteratively optimizing a model for calculating the output variable of the digital circuit using output data from the event counters and means for registering the selected portion of event counters and the optimized calculation model.

10 Claims, 4 Drawing Sheets

SYSTEM AND METHOD FOR DESIGNING DIGITAL CIRCUITRY WITH AN ACTIVITY SENSOR

This invention relates to a system for designing digital circuitry with an activity sensor. It also relates to a method implemented by this system and a corresponding computer program.

BACKGROUND OF THE INVENTION

The invention applies more particularly to a system for designing digital circuitry comprising:
- a digital circuit simulator based on a file containing a functional description of this digital circuit,
- means for estimating an output variable from the digital circuit when executing a test bench supplied to the simulator,
- event counters, the events being detected using control signals provided by the simulator when executing the test bench.

The event counters form an activity sensor for the simulated digital circuit. It is known to use data supplied by such a sensor to calculate, using a model yet to be defined, an actual output variable in the circuit, such as power consumption, released temperature, etc. Thus, by knowing the successive values of the output variable given by the simulation and data supplied by the event counters, it is known to build a model to calculate this output variable by linear regression. This model can then be implemented, using a monitor (to capture current activity) and a calculator (to apply the model) in the actual circuit that was previously simulated. The benefit of such a calculation is that it reports the circuit's activity based on implemented programs and adjusts the circuit's effort in dynamic control loops. The output from the calculation model can then feed into a regulation system that adjusts the frequency of the circuit's functional blocks and their voltage to optimize the estimated variable.

A problem arises when we want to apply such a model for calculating an output variable to a complex digital circuit, such as a system-on-chip (SoC) design. Because the surface of such a circuit is generally limited, it becomes necessary to make a selection on the control signals and hence on the event counters. Usually, the selection is done intuitively based on prior knowledge of the architecture. However, this is a tedious task that becomes complicated with the increasing complexity of the SoC.

DESCRIPTION OF THE PRIOR ART

For example, in the patents published under numbers U.S. Pat. No. 7,590,894, U.S. Pat. No. 7,269,756, and U.S. Pat. No. 6,356,615, a low-cost configurable monitoring unit is proposed for making this selection. The idea is to connect as many control signals as possible to this unit. It is then configured to indicate the signals whose changes are tracked. The configuration is done at the application level with predefined instructions. More specifically, U.S. Pat. No. 7,590,894 proposes to integrate an encoder/decoder to implement this configuration logic; U.S. Pat. No. 7,269,756 uses a mask register with upstream combinatory logic; and in U.S. Pat. No. 6,356,615, the counters can be configured to monitor signals and combine two or more of them in the system.

In the article by Pedderson et al., entitled "CLIPPER: Counter-based low impact processor power estimation at run-time," published in the proceedings of ASP-DAC'07, 12th Asia and South Pacific Design Automation Conference 2007, pages 890-895, Jan. 23-26, 2007, an algorithm is proposed for selecting signals based on a direct observation of the forms of the signals and the consumption profile. This approach is impractical or even unusable with specific and complex SoC circuits.

It may therefore be desirable to provide a digital circuit design system that can overcome at least some of the above problems and constraints.

SUMMARY OF THE INVENTION

The invention therefore relates to a system for designing digital circuitry comprising:
- a digital circuit simulator based on a file containing a functional description of this digital circuit,
- means for estimating an output variable from the digital circuit when executing a test bench supplied to the simulator,
- event counters, the events being detected using control signals provided by the simulator when executing the test bench, further comprising:
- means for selecting a portion of the event counters by iteratively optimizing a model for calculating the output variable of the digital circuit using output data from the event counters, and
- means for registering the selected portion of event counters and the optimized calculation model.

By iteratively combining a progressive optimization of the calculation model with a progressive selection itself of the event counters ultimately participating in the model, it becomes possible to make an effective and automatic selection of counters, even from an initially large number of potentially candidate event counters. Moreover, as with any iterative optimization, a stop criterion can be chosen to limit the number of counters selected. Therefore, from the moment a digital circuit can be simulated based on a functional description file, even if it is complex, unusual, or a SoC circuit, it becomes possible to size its activity sensor upstream in its manufacturing in order to produce circuits capable of calculating their own output variable (consumption, temperature, etc.).

Optionally, the means for estimating an output variable of the digital circuit comprise a consumption simulator designed to provide a profile of the power consumed by the simulated digital circuit at each instant when executing the test bench.

The invention also relates to a method for designing digital circuitry comprising the steps consisting of:
- simulating the operation of a digital circuit based on a file containing a functional description of this digital circuit,
- estimating an output variable of the digital circuit when executing a test bench supplied as input to the simulation,
- counting events detected using control signals supplied by the simulation when executing the test bench, further comprising the steps consisting of:
- selecting a portion of the counted events by iteratively optimizing a model for calculating the output variable of the digital circuit using event count data, and
- registering the selected portion of counted events and the optimized calculation model.

Optionally, before the selection step, the estimated output variable and the event counter output data are synchronized by sampling their values according to a common predetermined period.

Also optionally, before the selection step, a portion of the counted events is preselected by keeping only the events counted using signals having fewer bits than a predetermined limit and/or keeping only the events counted using signals that are independent of one another, this independence being measured by cross-correlation.

Also optionally, the selection step is carried out according to a step-by-step regression method.

Also optionally, the step-by-step regression method comprises a linear regression, the calculation model to be optimized being a linear combination of event count data and a regression constant.

Also optionally, the step-by-step regression method comprises:
- a first step to select a first counted event, by calculating correlations between the count data values for each event and the estimated output variable values and by selecting the counted event with the highest correlation,
- a second step to integrate the first counted event selected into the calculation model by least squares minimization.

Also optionally, after the first and second steps of selecting and integrating the first counted event, the step-by-step regression method comprises looping through following steps at least one time:
  select a new counted event, by calculating partial correlations between the count data values for each event that is not yet integrated into the model and the output variable values estimated by cancelling out any counted event that is already integrated into the model and by selecting the counted event that optimizes a significance test related to its partial correlation,
  if the significance test provides a type I probability value below a first predetermined threshold value:
    update the partial correlations for any counted event already integrated into the model by cancelling out any other counted event already integrated into the model and the new selected counted event and then output from the model any counted event whose updated partial correlation significance test is greater than a second predetermined threshold value, and
    integrate the new selected counted event into the calculation model by least squares minimization, this integration further comprising an update to an adjusted $R^2$ coefficient of determination for the calculation model,
  exit the loop of steps:
    if the significance test for the new selected counted event is greater than the first threshold value, keeping the last model obtained by least squares minimization as the optimal model, or
    if the update to the adjusted $R^2$ coefficient of determination causes its value to decrease, keeping the second to last model obtained by least squares minimization as the optimal model.

Finally, the invention also relates to a computer program that can be downloaded from a communication network and/or saved on a computer-readable medium and/or executed by a processor, comprising instructions for executing the steps of a method for designing digital circuitry according to the invention, when said program is executed on a computer.

BRIEF DESCRIPTION OF THE DRAWINGS

The invention will be better understood using the following description, given purely as reference and referring to the accompanying drawings, wherein.

DESCRIPTION OF THE PREFERRED EMBODIMENTS

The description that follows comprises two distinct parts, which are independent of one another despite being able to be advantageously combined.

The first part relates to a system and a method for designing digital circuitry comprising a selection of event counters whose outputs are intended to feed into an output variable calculation model for a digital circuit. This selection is done by simulating the operation of the digital circuit based on a test bench and on an optimization criterion for a predetermined calculation model. The first part also relates to a digital circuit using the calculation model optimized during the selection of event counters to estimate this output variable without needing to measure it directly.

The second part relates to a system and a method for designing digital circuitry comprising the building of a model to calculate a digital circuit output variable, as well as a digital circuit using such a calculation model to estimate this output variable without needing to measure it directly.

The first part is independent of the second in the sense that it is not essential for building a calculation model after having selected the event counters. The predetermined calculation model as optimized at the end of the first part may be enough. The second part is independent of the first in the sense that building the model does not necessarily assume a preselection of the event counters as carried out in the first part. The predetermined event counters must be provided as input to this second part, regardless of the method used for selecting them, so that the calculation model is built based on these counters. However, both parties may be advantageously combined in the sense that, after having selected the event counters based on a first predetermined model that can be optimized during the selection, a second model that is independent and different than the first can then be built based on these selected counters. These combined operations are carried out by a complete system for designing digital circuitry.

The digital circuit output variable whose calculation is desired is, for example, the power consumed by this circuit at each instant. This example will be used throughout the remainder of the description, but the invention relates to the calculation of other output variables, such as the quantity of heat emitted by the circuit at each instant or its temperature.

First Part: Selection of Event Counters by Simulating the Digital Circuit

Figure 1:
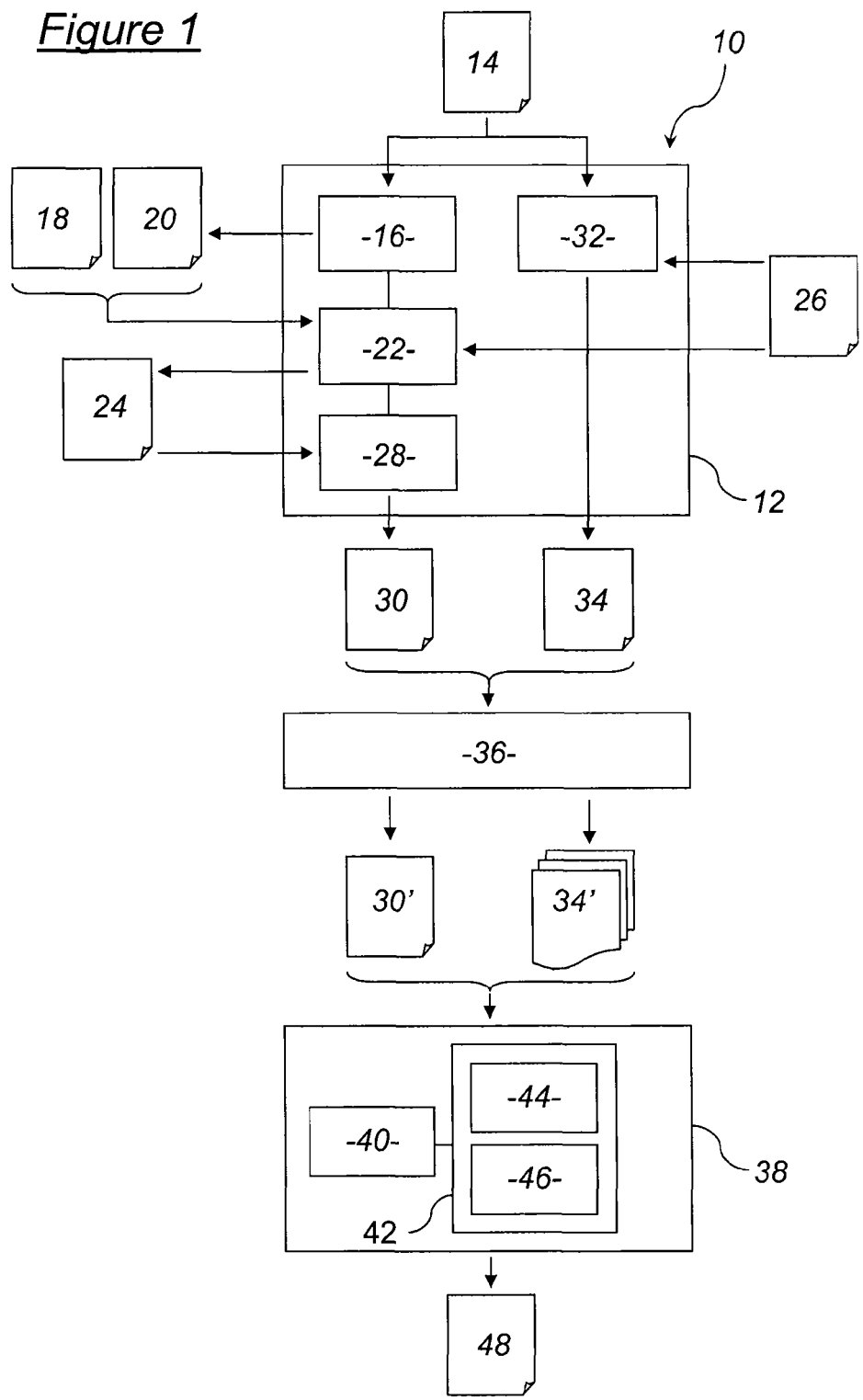
FIG. 1 schematically shows the general structure of a system for designing digital circuitry according to an embodiment of the invention.

The system 10 for designing digital circuitry shown in FIG. 1 comprises a simulator 12 of a digital circuit from a file 14 containing a functional description of this digital circuit. The file 14 is more specifically a file containing a description of the functional blocks making up the digital circuit, such as VHDL ("Very high speed integrated circuit Hardware Description Language") compliant, and specifically written in synthesizable RTL ("Register Transfer Level") language.

The simulator 12 first comprises a hierarchical synthesizer 16 that can create two structural description files 18 and 20 based on the functional description file 14. This hierarchical synthesizer is, for example, the Design Compiler (trademark) tool. The first structural description file 18 supplied by the hierarchical synthesizer 16 is a file containing a description of the gates and connections between the digital circuit's functional blocks. The second structural description file 20 supplied by the hierarchical synthesizer 16, such as in SDF ("Standard Delay Format") format, is a file containing a description of the propagation times between the gates of the functional blocks.

The simulator 12 further comprises a post-synthesis simulator 22 that can supply an activity report file 24, such as in VCD ("Value Change Dump") format, from the two structural description files 18, 20 and a test bench file 26. This activity report file 24 more specifically reports on switching activity between the gates defined in the first structural description file 18 when executing the test bench 26.

The simulator 12 also comprises an output simulator 28 for a predetermined variable. In this example, this simulator 28 is a consumption simulator, such as the PrimePower (trademark) tool that is designed to supply, from the activity report file 24, a file 30 that profiles the power consumed at each instant by the simulated digital circuit when executing the test bench 26. If other output variables must be estimated (heat exchange, circuit temperature, etc.), the simulator 28 must simply be adapted accordingly.

Finally, the simulator 12 comprises a functional simulator 32 that can supply a file 34 containing events detected using control signals provided by simulated event detectors. An event for a control signal, regardless of whether the signal is binary or multi-bit coded, is defined as any passage from one level to another in the values that can take this control signal. There are therefore as many events to count as there are control signals, which can be captured at each gate or at each connection end of the digital circuit's functional blocks. Events are registered with delta cycle accuracy when executing the test bench 26.

The power consumption profile file 30 and the event file 34 are supplied, as output from the simulator 12, to an interface 36 of the system 10 for designing digital circuitry whose main function is to synchronize the data in these two files so as to map detected events and information on the power consumed at each instant, and whose optional function is to preselect events. Preselection first consists of really identifying the control signals. Only signals with fewer bits than a certain limit are used, thereby rejecting the data and address buses. It secondly consists of keeping only the independent control signals. Duplicate signals, which are identical but offset (ex. input and output signals of a flip-flop), opposite, supplied as input to amplifiers, etc., are thus eliminated. More generally, a cross-correlation between the control signals may be calculated by the interface 36 in order to preselect only the ones that are truly independent.

A synchronized power consumption profile file 30' and a plurality 34' of synchronized and preselected event files (for example, a file for each event) are supplied as output from the interface 36. The files 34' thus form event counters.

The system 10 for designing digital circuitry further comprises a selection and modeling module 38. Its first function is to select a portion of the event counters 34' supplied by the interface by iteratively optimizing a model calculating the digital circuit's power consumption using output data from the event counters. Its second function is to build a model to calculate the power consumption of the digital circuit that can estimate this consumption without needing to measure it. The first function is covered by this first part. The second function will be detailed in the second part.

This selection and modeling module 38 is, for example, implemented in a computer device, such as a conventional computer comprising a processor 40 with one or more memory(ies) identified by the generic reference 42. The memory 42 stores one or more computer programs 44, 46 made up of sequences of instructions that, when they are executed by the processor 40, carry out the following functions:

selecting a portion of the events counted by iteratively optimizing a model for calculating the power consumption of the digital circuit using event count data (program 44), building a model for calculating the power consumption of the digital circuit that can estimate this consumption from selected count data (program 46).

Also note that the computer programs 44, 46 are shown as being separate, but this separation is purely functional. They may just as well be grouped into one or more software programs. Their functions could also be at least partly microprogrammed or micro-wired in dedicated integrated circuits. Thus, alternatively, the computer device implementing the selection and modeling module 38 could be replaced by an electronic device comprised solely of digital circuits (without a computer program) for carrying out the same actions.

Note also that the simulator 12 and the interface 36 can be implemented by a computer such that the whole digital circuit design system 10 can be implemented in a computer device with a processor and shared means of storage.

The selection and modeling module 38 provides as output a record from the selected portion of event counters and the optimized calculation model. This record is, for example, provided in the form of a file 48 that can be used when manufacturing the digital circuit that was simulated.

Figure 2:
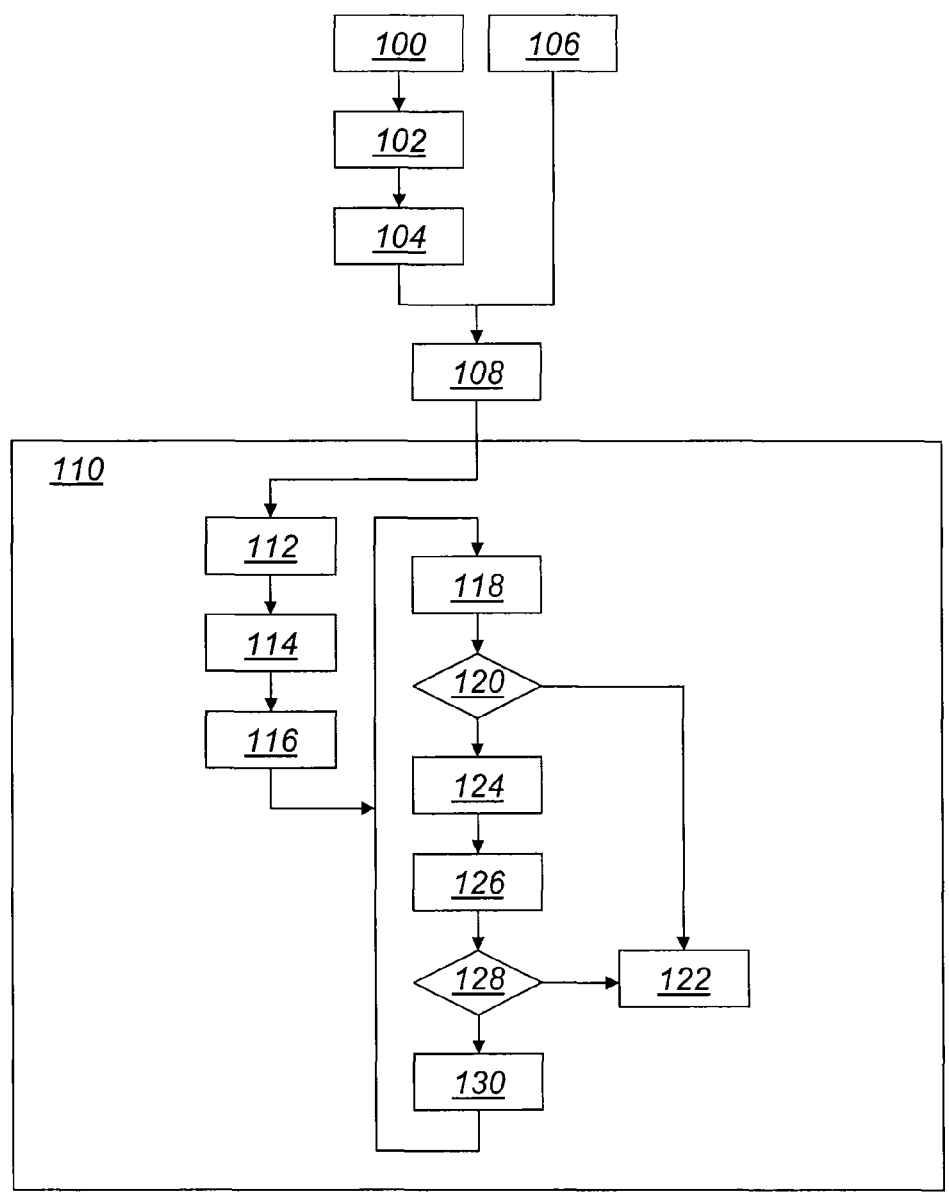
FIG. 2 illustrates the successive steps of a first method implemented by the system in FIG. 1 for selecting digital circuitry event counters, FIG. 3 schematically shows the overall structure of a digital circuit designed to use an output variable calculation model provided by executing the selection method in FIG. 2.

The system 10 for designing digital circuitry implements a method such as the one illustrated in FIG. 2.

During a first step 100 of this method, upon activation of the hierarchical simulator 16, the two structural description files 18 and 20 are supplied using the functional description file 14 for a given digital circuit.

During a second step 102, upon activation of the post-synthesis simulator 22, the activity report file 24 is supplied using the two structural description files 18, 20 and the test bench file 26.

During a next step 104, upon activation of the consumption simulator 28, the file 30 profiling the power consumed at each instant by the simulated digital circuit is supplied from the activity report file 24.

Parallel to steps 100, 102, and 104, during a step 106, upon activation of the functional simulator 32, the event file 34 is supplied from the functional description file 14 and the test bench file 26.

Following the steps 100, 102, 104, and 106, we proceed to a step 108 during which, upon activation of the interface 36, events may optionally be preselected to provide a plurality of files forming event counters, and this plurality of files is synchronized with the power consumption profile file 30 to supply the files 30' and 34'. At this time, a sampling period T is defined in order to divide the power consumption profile into a series of sampled power consumptions, each value in this series being the average of the instant powers simulated within the corresponding time window T. The preselected event counters are also sampled along this same period T. For each preselected event counter, a series of count data is generated, each value in this series being the number of corresponding counted events within the corresponding time window T.

Then, a method 110 for selecting a portion of the event counters 34' is implemented by the program 44 being executed by the processor 40.

This selection method 110 is carried out according to a step-by-step regression method based on a predetermined model for calculating the power consumed by the digital circuit using a portion of the preselected event counters. The calculation model is, for example, linear, such as:

$$P_T = c + \alpha_1 \cdot N_{C_1} + \ldots + \alpha_i \cdot N_{C_i} + \ldots + \alpha_n \cdot N_{C_n},$$

where:

$\{C_i\}_{i=1:n}$ is the set of event counters participating in the calculation model, n characterizing the complexity of the model, $N_{C_i}$ is the number of events counted by the event counter $C_i$ in a time window T, $P_T$ is the average power consumed within this same time window T, such that it can be deduced from the values $N_{C_i}$ using the calculation model, c is the model's regression constant, encompassing the static power of the digital circuit and a corrective term for the model, $\alpha_i$ is the coefficient quantifying the partial consumption of the integrated circuit due to the activity detected by the event counter $C_i$.

The regression constant and the coefficients $\alpha_i$ are iteratively determined by optimizing the calculation model when executing the selection method 110, as will now be detailed.

Thus, during a step 112, a correlation is calculated between each series ($N_{C_i}$) and the series ($P_T$) of sampled power consumptions. The series ($N_{C_1}$) with the highest correlation is selected during this step, and the corresponding event counter is integrated into the calculation model.

Then, during a step 114, a first version marked MOD(1) of the model for calculating the power consumption, depending only on ($N_{C_1}$), is estimated by determining the regression constant c and the coefficient $\alpha_1$ corresponding to the event counter used in the model. This estimation is carried out in a known manner using a least squares minimization method. Also during this step, the adjusted $R^2$ coefficient of determination is calculated for the model MOD(1). This coefficient $R^2$ is between 0 and 1. It is used to judge the quality of the fit between the model MOD(1) and the measures (i.e. the series ($N_{C_1}$) and ($P_T$)). This is the ratio between the amount of information explained by the model and the associated error residual weighted by the complexity of the model. It increases as the increasing complexity of the model is justified by a sufficient increase in its quality, and decreases otherwise.

The next step 116 initializes an iteration counter value k to 2, and then during a step 118, a partial correlation is calculated between each series ($N_{C_i}$) that has not yet been integrated into the model MOD(k−1) and the series ($P_T$) of sampled power consumptions. These partial correlations are calculated by cancelling out series that have already been integrated into the model MOD(k−1). They then undergo a traditional significance test providing a "p-value" for each partial correlation. This p-value is the probability of committing a type I error on the null hypothesis of the corresponding partial correlation. The series ($N_{C_k}$) with the lowest p-value Vp is selected during this step.

This p-value Vp is compared to a first threshold p-value VpIN during a test step 120. VpIN represents an event counter's input threshold value in the calculation model. By default, it is set to 0.05, for example. The lower the value, the more it limits the number of event counters that will ultimately be integrated into the model, which then becomes simpler, but less accurate. If the p-value Vp for the series ($N_{C_k}$) selected during the previous step is greater than VpIN, we proceed to a step 122 as output from the selection method 110.

During this output step 122, the model MOD(k−1) is considered to be the optimized calculation model and is registered with its parameters by the design system 10. Similarly, the event counters taken into account in this model MOD(k−1) are ultimately considered relevant for estimating the power consumption and are registered as such by the design system 10. Note that the event counter corresponding to the last series ($N_{C_k}$) selected during the step 118 of the current iteration k is not integrated into the calculation method.

If instead the p-value Vp for the series ($N_{C_k}$) selected during the step 118 is less than VpIN, we proceed to a step 124 to check the event counters integrated into the calculation model MOD(k−1). During this step, a new partial correlation is calculated between each series integrated into the model MOD(k−1) and the series ($P_T$) of sampled power consumptions. These new partial correlations are calculated by cancelling out the other series that have already been integrated into the model MOD(k−1) and the most recently selected series ($N_{C_k}$). They then undergo the traditional significance test that provides a p-value for each new partial correlation. Indeed, integration of a new event counter into the calculation model checks the p-values for all of the other event counters. Thus, any series ($N_{C_i}$) for an event counter that has already been integrated into the model and that has a p-value greater than a second threshold p-value VpOUT produces the exit, from the model, of the corresponding counter. The value VpOUT is, for example, set to 0.1 by default. It is necessarily greater than VpIN and, as for VpIN, the lower it is, the more it limits the number of event counters that will ultimately be integrated into the model.

Then, during a step 126, a new version marked MOD(k) of the model for calculating the power consumption is estimated by updating the regression constant c and the coefficients $\alpha_i$ corresponding to the event counters that were previously integrated into the calculation model and not deleted. This estimation is carried out in a known manner using a least squares minimization method. During this same step, the adjusted $R^2$ coefficient of determination is calculated for the model MOD(k). It is used to judge the quality of the fit between the model MOD(k) and the measures (i.e. the series ($N_{C_i}$) corresponding to the selected event counters and ($P_T$)).

During a next test step 128, the $R^2$ coefficient of the model MOD(k) is compared to the $R^2$ coefficient of the model MOD(k−1). If it is lower, then we move to the output step 122. Otherwise, we proceed to a step 130 to increment the counter k by one unit, and then we return to the step 118 for a new iteration.

As output from the selection method, the event counters $C_1, \ldots, C_n$ used for the power consumption calculation model are the counters from the model MOD(k−1) for the last value of k. The optimized calculation model that can be used to estimate the power consumed by the simulated circuit is then defined fully by the corresponding coefficients c, $\alpha_1, \ldots, \alpha_n$.

Figure 3:
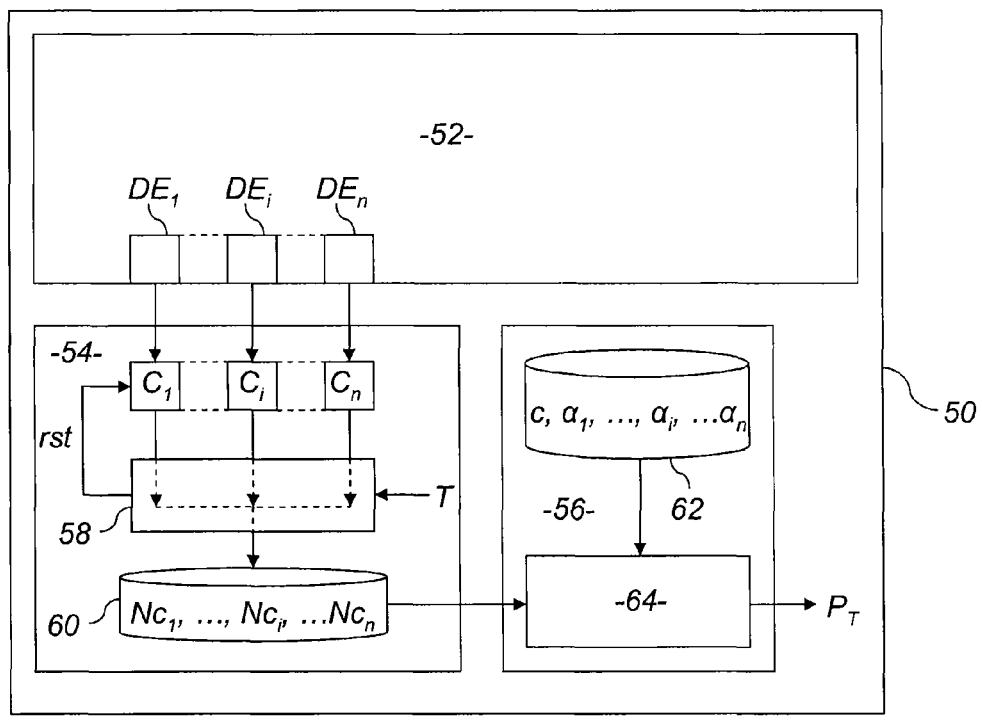

An actual digital circuit 52 implementing such a model for calculating its own power consumption can then be designed, as illustrated in FIG. 3. In this figure, a digital circuit 50 comprises the digital circuit 52 that was previously simulated by the design system 10. It is, for example, a SoC circuit. Depending on the selection made by the design system 10, the previously simulated digital circuit 52 is equipped with event detectors $DE_1, \ldots, DE_n$ related to the counters that were selected when executing the program 44.

The digital circuit 50 further comprises a monitor 54 and a calculator 56 that allows it to use the optimized calculation model to estimate its power consumption. More specifically, the monitor 54 comprises the registers $C_1, \ldots, C_n$ forming the event counters that can receive information on events supplied by the detectors $DE_1, \ldots, DE_n$. All of the registers form an activity sensor for the previously simulated digital circuit 52. It further comprises a control module 58 designed to, automatically and for each sampling period T (i.e. controlled by a timer), read the contents $Nc_1, \ldots, Nc_n$ of the registers $C_1, \ldots, C_n$, transfer these contents $Nc_1, \ldots, Nc_n$ to a memory 60, and reset the registers $C_1, \ldots, C_n$ by sending a rst reset signal. The calculator 56 comprises a memory 62 storing the coefficients $c, \alpha_1, \ldots, \alpha_n$ optimized during the execution of the program 44. It further comprises a processor 64 that can calculate for each period T the value $P_T$ of power consumed by the previously simulated digital circuit 52 using these coefficients $c, \alpha_1, \ldots, \alpha_n$ stored in memory 62, upon regular receipt of the values $Nc_1, \ldots, Nc_n$ supplied by the monitor 54.

A real world example of a digital circuit implementing such a model for calculating its own power consumption is a RAM (Random Access Memory) whose selected event counters are the counters associated with the Chip_Select and Write_Enable signals. At each period T, the contents of these two counters are read by the control module 58 and provided to the calculator 56 for the application of an optimized linear regression model with three coefficients $c, \alpha_1$ et $\alpha_2$.

Clearly, a system for designing digital circuitry with an activity sensor as described above allows for an automatic and efficient selection of event counters with selection criteria (VpIN) or stop criteria (VpOUT, $R^2$ coefficient) that can be set up to control the size of the activity sensor.

Furthermore, the implemented step-by-step regression method makes it possible to rank the event counters selected based on their relevance to the model by the weight associated with them. Thus, the event counters to be used in the model are selected based on the surface available for the activity sensor and this ranking.

Second Part: Modeling of the Digital Circuit Output Variable

Figure 4:
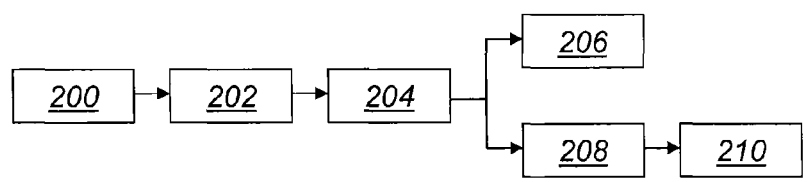
FIG. 4 illustrates the successive steps of a second method implemented by the system in FIG. 1 for building a digital circuit output variable calculation model from already selected event counters, and FIG. 5 schematically shows the overall structure of a digital circuit designed to use the output variable calculation model provided by executing the building method in FIG. 4.

The system 10 for designing digital circuitry also implements a method for building a model that calculates a digital circuit output variable as illustrated in FIG. 4. This method for building a calculation model is implemented by the program 46 being executed by the processor 40. Also in this example, the output variable is the power consumed at each instant by the simulated digital circuit when executing the test bench 26. The input data for the calculation model is the data supplied by the predetermined event counters, such as those selected in the first part. If the selection method in the first part is implemented, then the shortest possible sampling period is chosen for greater accuracy in the calculation model.

This method more specifically consists of building a plurality of models for calculating the power consumed by the digital circuit from a sequence of estimated power consumption data, such as the power consumption profile file 30', and output data from the selected event counters, such as the files 34' corresponding to the selected counters. Specifically, it attributes a plurality of possible modes to the power consumption, splits the power consumption profile into multiple successive sequences, and associates each sequence with a single mode from among the possible modes. Then, it builds a different power consumption calculation model for each possible mode.

This method of building a plurality of calculation models is carried out according to a hidden-state Markov model determination method, where each hidden state in the Markov model corresponds to one of the possible modes. The determination of the Markov model, and therefore the plurality of calculation models, is based on its maximum likelihood optimization relative to the power consumption profile 30' and the output data 34' from the selected event counters.

The hidden-state Markov model is, for example, an MSM (Markov Switching Model), as defined in the article by James D. Hamilton, entitled "Regime-switching models," published in Palgrave Dictionary of Economics, 2005. In this case, for each hidden state or mode the calculation model is, for example, linear, like:

$$P(E_j) = c_j + \alpha_{1,j} \cdot N_{C_1} + \ldots + \alpha_{i,j} \cdot N_{C_i} + \ldots + \alpha_{n,j} \cdot N_{C_n},$$

where:
- $\{C_i\}_{i=1:n}$ is the set of event counters selected to participate in the calculation method, n characterizing the complexity of the model,
- $N_{C_i}$ is the number of events counted by the event counter $C_i$ within a given time window, common to all event counters and in which the average power consumption is estimated, but not necessarily constant or equal to the sampling period defined in the first part,
- $P(E_j)$ is the average power consumed within this same given time window, such as it can be deduced from the values $N_{C_i}$ using the calculation model, associated with mode $E_j$,
- $c_j$ is the model's regression constant associated with mode $E_j$, encompassing the static power of the digital circuit and a corrective term for the model,
- $\alpha_{i,j}$ is the coefficient quantifying the partial consumption of the digital circuit due to the activity detected by the event counter $C_i$ when the power consumption profile conforms to mode $E_j$.

Note A the matrix with dimensions mx(n+1), where m is the number of hidden states in the Markov model MSM, using the regression constants and the coefficients from the plurality of models:

$$A = \begin{bmatrix} c_1 & \alpha_{1,1} & \ldots & \alpha_{n,1} \\ \ldots & \ldots & \ldots & \ldots \\ c_m & \alpha_{1,m} & \ldots & \alpha_{n,m} \end{bmatrix}.$$

We assume that the error residual for the Markov model MSM is Gaussian white noise with variance $\sigma$.

Finally, note $\Pi$ the matrix, with dimensions mxm, for probabilities of a transition from each state or mode Ei to each state or mode Ej:

$$\Pi = \begin{bmatrix} p_{11} & \ldots & p_{1m} \\ \ldots & \ldots & \ldots \\ p_{m1} & \ldots & p_{mm} \end{bmatrix}.$$

With these notations, the triplet $\Theta = (A, \sigma, \Pi)$ fully defines the Markov model MSM that can represent the process P for the average power consumed at each instance using output data from the selected event counters $C_1, \ldots, C_n$. The model parameters are determined, in a known manner, by estimating the maximum likelihood applied to the triplet $\Theta = (A, \sigma, \Pi)$ for the power consumption profile 30' and the output data 34' from the selected event counters, as will now be detailed with reference to the method for building the MSM model illustrated in FIG. 4.

During a first initialization step 200, the number m of desired hidden states or modes is defined. This can be a configurable value. During a next step 202, the event counters are initialized, and a constant is added to them to account for the regression constant for each hidden state or mode, thus forming an observation vector $X=(1, N_{C_1}, \ldots, N_{C_n})^T$.

Then, the estimate of the maximum likelihood applied to the triplet $\Theta=(A,\sigma,\Pi)$ for the selected files 30' and 34' is executed during a step 204. This execution is known and therefore will not be detailed. In summary, it maximizes the following likelihood function L:

$$L(\Theta; P_{1:T}; X_{1:T}) = \sum_{t=1}^{T} \sum_{E} f(P_{1:T} | E_t, X_t, A, \sigma) \cdot P(S_t | \Pi),$$

where T is the number of successive samples provided through simulation, with E designating the set of hidden states or modes.

As output from this step, a sequence of hidden states or modes is established for the power consumption sequence provided by the file 30' and observations 34'. Furthermore, the matrices A and Π are provided, thereby defining the plurality of power consumption calculation models for the plurality of corresponding modes and the probabilities of transitioning from one mode to another.

The steps 200, 202, and 204 may be repeated several times with different values of m, ultimately retaining the MSM model whose number of hidden states is optimal relative to the data supplied by the selected files 30' and 34'.

Following the step 204, we optionally, but advantageously in terms of simplifying the calculations, proceed to a step 206 for selecting the most relevant event counters. Out of n event counters selected in the first part, p can be kept to participate in the power consumption calculation, deleting the event counters with the lowest coefficients in the matrix A.

Also following the step 204, conventional correlation calculations during a step 108 can be used to match transitions from one mode to the other provided as output from the step 204 with event occurrences. These events are then qualified critical events, and their counters are selected to detect changes in consumption modes. In a possible embodiment that is advantageous in terms of simplifying calculations, the critical events are chosen from among the events related to the n-p counters that were not selected during the step 206. Thus, the simplification of the model due to the selection of p counters ultimately participating in the calculation is offset by the use of n-p other counters to detect the best possible transitions between consumption modes.

Following the step 208, a step 210 consists of establishing logical rules for operating a finite automaton or a finite state machine (i.e. the m modes), like an FSM (Finite State Machine) that can deterministically estimate the transitions form each mode to each other mode from the transitions observed on the critical events. Similarly, this step for converting the correlations established during the step 206 into transition rules of the finite state machine is within the scope of the prior art and will not be detailed.

Figure 5:
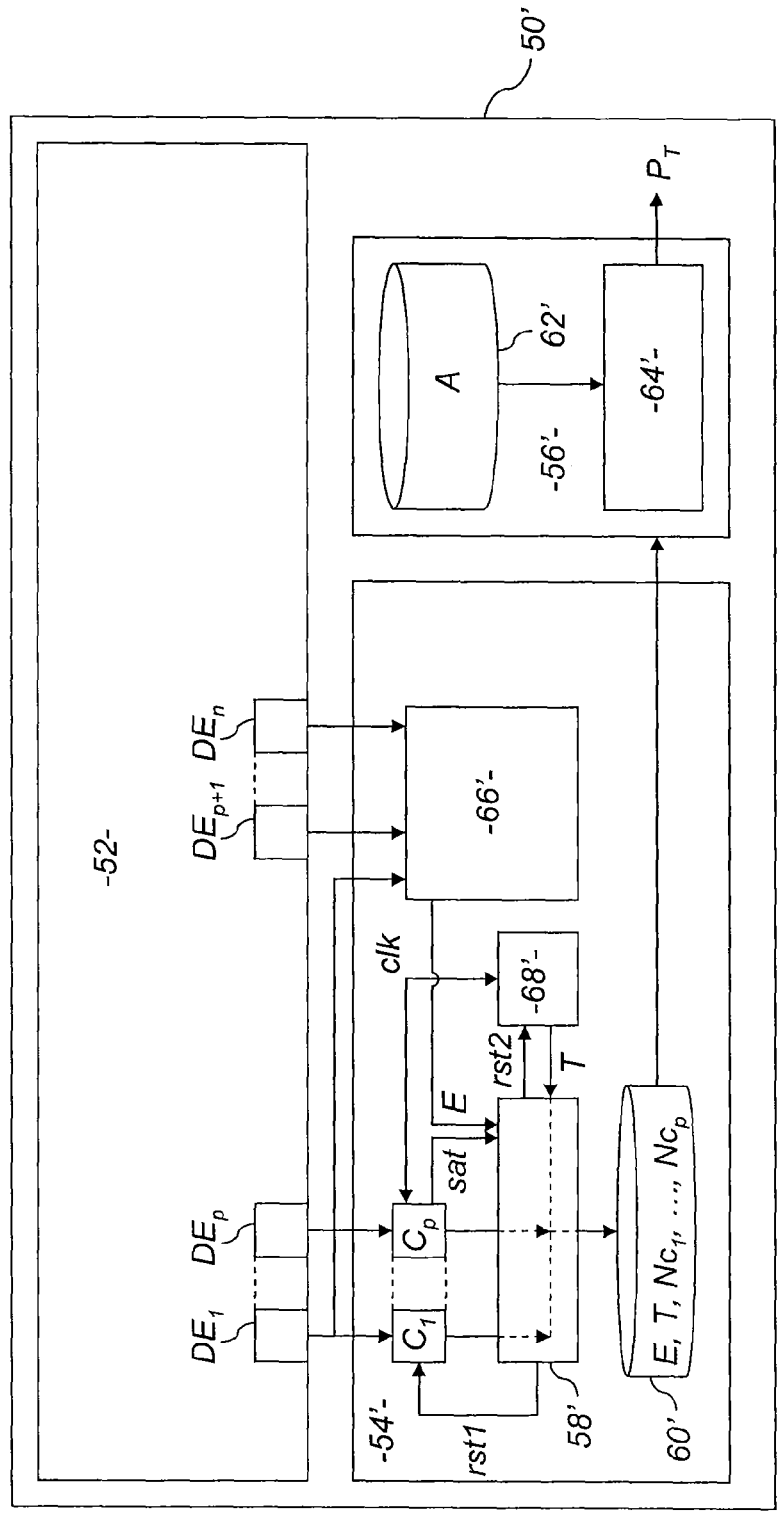

A digital circuit implementing a model for calculating its own power consumption based on the Markov model MSM built by executing the method in FIG. 4 can then be designed, as illustrated in FIG. 5.

In this figure, a digital circuit 50' comprises the digital circuit 52 that was previously simulated by the design system 10. It is, for example, a SoC circuit. Depending on the selection made by the design system 10, the previously simulated digital circuit 52 is equipped with event detectors $DE_1, \ldots, DE_n$ related to the counters that were selected when executing the program 44. The digital circuit 50' further comprises a monitor 54' and a calculator 56' that allows it to use the previously defined Markov MSM calculation model to estimate its power consumption.

More specifically, according to a previously mentioned possible embodiment by which only the first p counters from among the n counters selected in the first part are used for the power consumption calculation, the monitor 54' comprises the registers $C_1, \ldots, C_p$ forming these p event counters that can receive event information supplied by the first p detectors $DE_1, \ldots, DE_p$. All of these registers form an activity sensor for the previously simulated digital circuit 52. It further comprises a control module 58' designed to, automatically and for variable time windows T, read the contents $Nc_1, \ldots, Nc_p$ of the registers $C_1, \ldots, C_p$, transfer these contents $Nc_1, \ldots, Nc_p$ to a memory 60', and reset the registers $C_1, \ldots, C_p$ by sending a rst1 reset signal.

Unlike the embodiment in FIG. 3, and to improve the performance of the monitor 54', the monitor is not subject to a fixed sampling period. For this, it comprises a finite state machine module 66' that reproduces the logical rules established during the step 210. More specifically, according to a previously mentioned possible embodiment according to which only the n-p counters, other than those used for the power consumption calculation, are used to detect the transitions between consumption modes, the module 66' receives as input the event information supplied by the last n-p detectors $DE_{p+1}, \ldots, DE_n$. As output, it provides the control module 58' with information E of a new consumption mode for the digital circuit 52 each time that a transition to such a new mode E is detected. Of course, the module 66' can also receive as input at least a portion of the event information supplied by the first p detectors $DE_1, \ldots, DE_p$.

The automatic operations for reading the content $Nc_1, \ldots, Nc_p$ of the registers $C_1, \ldots, C_p$, transferring this content to a memory 60', and resetting the registers $C_1, \ldots, C_p$ are, for example, controlled by the following two events:
saturation of at least one of the registers $C_1, \ldots, C_p$. For this, the control module 58' receives a sat signal, indicating saturation, when such an event occurs,
change to the consumption mode. This change in mode E is communicated to the control module 58' by the module 66'.

Because these events are unpredictable, the monitor 54' further comprises a timer 68', using the same clock clk as the one that synchronizes the registers $C_1, \ldots, C_p$, that can supply the time T that has elapsed between two resets of the registers $C_1, \ldots, C_p$. The timer 68' is reset by the control module 58' using a reset signal rst2, whenever the registers $C_1 \ldots, C_p$ are reset. The values of E and T are then sent by the control module 58' to the memory 60' with the contents $Nc_1, \ldots Nc_p$ of the registers $C_1, \ldots, C_p$. Therefore, the memory 60' stores a history of the successive consumption modes, the duration of each of these successive modes, and their count data $Nc_1, \ldots, NC_p$.

The calculator 56' comprises a memory 62' storing the coefficients from the matrix A, calculated during the execution of the program 46. It further comprises a processor 64' that can calculate, for each variable time window T, the average value $P_T$ of the power consumed at each instant by the previously simulated digital circuit 52 during this time T, using coefficients from the matrix A stored in memory 62', upon receipt of the values E, T, $Nc_1, \ldots, Nc_p$ provided by the monitor 54'. This is just for it to select the right linear regression model in the matrix A using the value of E and deducing from it the value of $P_T$ using the values $Nc_1, \ldots, Nc_p$.

To take the real world example of the RAM whose event counters selected in the first part are the counters associated with the Chip_Select and Write_Enable signals, we can apply a Markov model MSM with four hidden states, corresponding to the following four consumption modes: read, write, alternating read/write, undetermined. According to the Markov model MSM, each of these four consumption modes has its own consumption model. We can then demonstrate that we can limit ourselves to the Chip_Select event counter to calculate the average power consumed by the RAM at each instant.

In addition, the finite state machine detecting the transitions between the four predefined consumption modes can be defined as follows, upon receipt of the Chip_Select and Write_Enable signals:
from "read" mode, it goes to "alternating" mode when the Write_Enable signal changes to "1",
from "write" mode, it goes to "alternating" mode when the Chip_Select signal changes to "1" and the Write_Enable signal changes to "0",
from "alternating" mode, it goes to "read" mode when the number of consecutive reads surpasses a predetermined number, such as 16,
from "alternating" mode, it goes to "write" mode when the number of consecutive writes surpasses a predetermined number, such as 16,
from "undetermined" mode, it goes to "read" mode when the Chip_Select signal changes to "1" and the Write_Enable signal changes to "0",
from "undetermined" mode, it goes to "write" mode when the Write_Enable signal changes to "1".

With each mode change or saturation of the counter register for the Chip_Select signal, the content of the register is read by the control module 58' and supplied to the calculator 56' with the values E and T to apply an optimized linear regression model with two coefficients chosen in the matrix A based on the consumption mode detected by the four-state machine.

Clearly, a system for designing digital circuitry using an activity sensor, such as is described in the second part, can be used to build a plurality of models for calculating a digital circuit output variable that can be broken down into multiple modes, thereby making these models more accurate for little to no overhead due to the fact that some event counters can be omitted in the models, offsetting their absence by including different modes.

Furthermore, building the plurality of models by determining a hidden Markov model using the maximization of a likelihood function results in obtaining calculation models that can be selected using a finite state machine, independent of a sampling frequency. This property provides greater flexibility for the activity sensor and synchronization savings. The activity sensor and the calculator no longer communicate periodically as generally recommended in the prior art, but rather upon indications of transitions received from the finite state machine or upon saturation of at least one activity sensor counter.

Also note that the invention is not limited to the embodiments described above. As is known to those skilled in the art, there are various modifications that can be made to the embodiments described above, with respect to the instruction that has been disclosed. In the following claims, the terms used should not be interpreted as limiting the claims to the embodiments presented in this description, but should be interpreted to include all of the equivalents that the claims intend to cover by their formulation and whose projection is within reach of those skilled in the art by applying their general knowledge to the instruction that has just been disclosed.

The invention claimed is:

1. A system for designing digital circuitry comprising:
a digital circuit simulator to simulate operation of a digital circuit based on a file containing a functional description of the digital circuit;
means for estimating an output variable from the digital circuit when executing a test bench supplied to the simulator;
means for counting events detected using control signals provided by the simulator when executing the test bench;
means for selecting a portion of the counted events by iteratively optimizing an analytical model that calculates the output variable of the digital circuit using output data from the counted events, wherein when selecting a portion of the counted events from an initially large number of potential candidate events with any iterative optimization, a stop criteria can be chosen to limit a number of counted events selected; and
means for registering the selected portion of counted events and the optimized analytical model.

2. A system for designing digital circuitry according to claim 1, wherein the means for estimating an output variable of the digital circuit comprise a consumption simulator designed to provide a profile of the power consumed by the simulated digital circuit at each instant when executing the test bench.

3. A method for designing digital circuitry comprising:
simulating, by a computer, operation of a digital circuit based on a file containing a functional description of the digital circuit;
estimating an output variable of the digital circuit when executing a test bench supplied as input to the simulation;
counting events detected using control signals supplied by the simulation when executing the test bench;
selecting a portion of the counted events by iteratively optimizing an analytical model that calculates the output variable of the digital circuit using event count data wherein when selecting a portion of the counted events from an initially large number of potential candidate events with any iterative optimization, a stop criteria can be chosen to limit a number of counted events selected; and
registering the selected portion of the counted events and the optimized analytical model.

4. A method for designing digital circuitry according to claim 3, wherein, before the selection step, the estimated output variable and the event count output data are synchronized by sampling their values according to a common predetermined period.

5. A method for designing digital circuitry according to claim 3, wherein, before the selection step, a portion of the counted events is preselected by keeping only the events counted using signals having fewer bits than a predetermined limit and/or keeping only the events counted using signals that are independent of one another, this independence being measured by cross-correlation.

6. A method for designing digital circuitry according to claim 3, wherein the selection step is carried out according to a step-by-step regression method.

7. A method for designing digital circuitry according to claim 6, wherein the step-by-step regression method comprises a linear regression, the calculation model to be optimized being a linear combination of event count data and a regression constant.

8. A method for designing digital circuitry according to claim 6, wherein the step-by-step regression method comprises:
   selecting a first counted event, by calculating correlations between the count data values for each event and the estimated output variable values and by selecting the counted event with the highest correlation,
   generating the first counted event selected into the calculation model by least squares minimization.

9. A method for designing digital circuitry according to claim 8, wherein, after the first and second steps of selecting and integrating the first counted event, the step-by-step regression method comprises looping through following steps at least one time:
   selecting a new counted event, by calculating partial correlations between the count data values for each event that is not yet integrated into the model and the output variable values estimated by cancelling out any counted event that is already integrated into the model and by selecting the counted event that optimizes a significance test related to its partial correlation,
   if the significance test provides a type I probability value below a first predetermined threshold value:
   updating the partial correlations for any counted event already integrated into the model by cancelling out any other counted event already integrated into the model and the new selected counted event and then output from the model any counted event whose updated partial correlation significance test is greater than a second predetermined threshold value, and
   integrating the new selected counted event into the calculation model by least squares minimization, this integration further comprising an update to an adjusted $R^2$ coefficient of determination for the calculation model,
   exit the loop of steps:
   if the significance test for the new selected counted event is greater than the first threshold value, keeping the last model obtained by least squares minimization as the optimal model, or
   if the update to the adjusted $R^2$ coefficient of determination causes its value to decrease, keeping the second to last model obtained by least squares minimization as the optimal model.

10. A method for designing digital circuitry, wherein the method is stored as computer-readable instructions on a network for download or encoded onto a non-transitory computer-readable medium, the computer-readable instructions when executed by a computer cause the computer to perform the method, comprising:
   simulating, by a computer, operation of a digital circuit based on a file containing a functional description of the digital circuit;
   estimating an output variable of the digital circuit when executing a test bench supplied as input to the simulation;
   counting events detected using control signals supplied by the simulation when executing the test bench;
   selecting a portion of the counted events by iteratively optimizing an analytical model that calculates the output variable of the digital circuit using event count data, wherein when selecting a portion of the counted events from an initially large number of potential candidate events with any iterative optimization, a stop criteria can be chosen to limit a number of counted events selected; and
   registering the selected portion of the counted events and the optimized analytical model.

* * * * *